US006934172B2

United States Patent
Regev et al.

(12) 
(10) Patent No.: US 6,934,172 B2
(45) Date of Patent: Aug. 23, 2005

(54) PRIORITY ENCODER FOR SUCCESSIVE ENCODING OF MULTIPLE MATCHES IN A CAM

(75) Inventors: Alon Regev, Woodland Hills, CA (US); Zvi Regev, West Hills, CA (US)

(73) Assignee: Micron Technology, Inc., Boise, ID (US)

( * ) Notice: Subject to any disclaimer, the term of this patent is extended or adjusted under 35 U.S.C. 154(b) by 163 days.

(21) Appl. No.: 10/330,269

(22) Filed: Dec. 30, 2002

(65) Prior Publication Data

US 2004/0125633 A1 Jul. 1, 2004

(51) Int. Cl.[7] .............................................. G11C 15/00
(52) U.S. Cl. ..................................... 365/49; 711/108
(58) Field of Search .................... 365/49, 205; 711/108

(56) References Cited

U.S. PATENT DOCUMENTS 6,717,876 B2 * 4/2004 Vlasenko et al. ........... 365/207
6,718,433 B1 * 4/2004 Pereira ....................... 711/108
2003/0223259 A1 * 12/2003 Roth ............................ 365/49

* cited by examiner

*Primary Examiner*—Richard Elms
*Assistant Examiner*—N Nguyen
(74) *Attorney, Agent, or Firm*—Dickstein Shapiro Morin & Oshinsky LLP (57) ABSTRACT

A priority encoder includes a highest priority indicator configured to receive data on multiple content addressable memory (CAM) match lines and flag a highest priority active match line. A multiple match detector detects the presence of multiple simultaneously active match lines. Logic circuitry disables an active match line flagged by the highest priority indicator. The highest priority indicator successively cycles so long as the multiple match detector detects the presence of multiple simultaneously active CAM match lines.

43 Claims, 5 Drawing Sheets

PRIORITY ENCODER FOR SUCCESSIVE ENCODING OF MULTIPLE MATCHES IN A CAM

BACKGROUND OF THE INVENTION

1. Field of the Invention

The present invention relates to content addressable memories, and more specifically, to a content addressable memory having an improved priority encoder.

2. Brief Description of the Related Art

Priority encoders are electronic logic circuits that determine which of a number of inputs has the highest or lowest priority. Priority encoders are used in a number of computer systems, as well as other applications. Priority encoders can be utilized in conjunction with a content addressable memory (CAM), for example.

A CAM is a memory device in which data is accessed based upon its content, rather than its storage address or location. A CAM generally includes multiple data storage locations comprising multiple memory cells. Contrary to DRAMs and SRAMs content addressable memories do not store data in any structured fashion. The locations at which data is stored within CAM can be merely random, where the data can be written directly into the first empty location within the CAM. Once data is stored in CAM, it can be found by comparing every bit in the CAM memory cells with data placed in a comparand register. Unlike random access memory ("RAM"), all data words in the storage locations of a CAM may be simultaneously compared with a search word stored in a comparand register. Data words stored in the CAM are compared with the search word. A match line is activated for each data word that matches the search word. If a match exists for every bit stored in a particular location within the CAM corresponding to every bit in the comparand, a match line is asserted. A priority encoder can then sort out which matching location among multiple match lines has the top priority. CAM devices are unique in that a user generally supplies the data and receives back an address for that data. Because the CAM does not require address lines to find data, the depth of the CAM can be extended as far as desired—well beyond the depth of a RAM.

A CAM device is useful in any application requiring fast searches of a database, lists, or pattern, and supplies heightened performance advantages over other memory search algorithms. Currently, CAMs are particularly well suited for handling packet protocols, such as TCP/IP protocols employed in packet processors that are used to route information across an intranet or the Internet.

In a typical application, a CAM may generate multiple match signals on active match lines in response to a search request. Typically, the match signals are sent to a priority encoder to determine the single address corresponding to the highest priority match.

Figure 1:
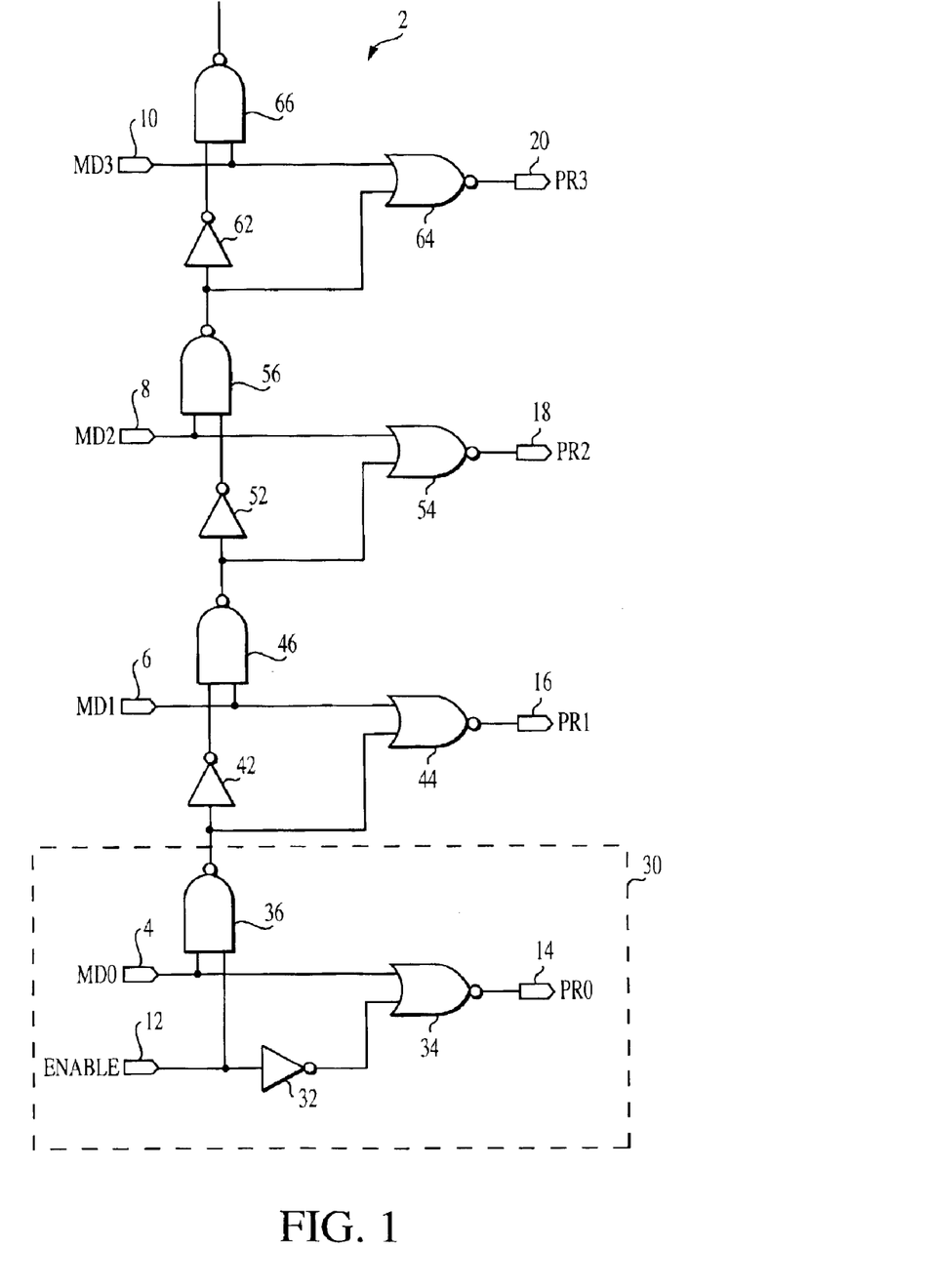
FIG. 1 is an embodiment of a typical highest priority indicator of a known priority encoder.

A typical priority encoder has two stages. The first stage is a Highest Priority Indicator (HPI), which flags one output associated with the active input having the highest priority. A typical prior art HPI 2 is shown in FIG. 1. The second stage of the typical priority encoder is an address encoder, which converts the flag from the HPI into a binary number identifying the address of the flagged output.

Referring to FIG. 1, HPI 2 typically operates like a "thermometer" in determining which of the match results has the highest priority. Conventionally, match inputs from respective match lines in a CAM are applied to terminals 4, 6, 8, and 10, etc., of HPI 2. An enable signal is provided on line 12. When multiple matches are encountered, the match line located on the lowest segment of the HPI is given the highest priority, by convention. The match line that indicates a match on inputs 4, 6, 8, 10 and which has the highest priority will cause the lowest output terminal 14, 16, 18, 20 to change states, indicating a match.

As shown in FIG. 1, HPI 2 utilizes an arrangement of logic gates to determine which of the inputs has the highest priority. Each segment of HPI 2 includes a NOT gate, a NAND gate, and a NOR gate. Referring to FIG. 1, highest priority stage 30 includes NOT gate 32 which inverts enable input 12, and supplies it to NOR gate 34. NOR gate 34 also receives a signal on match line input 4. Enable input 12 is supplied to NAND gate 36, along with match line input 4. The result from NOR gate 34 is supplied on output terminal 14.

HPI 2 includes several such stages, of which four are shown in FIG. 1. Thus, the result from NAND gate 36 is supplied to the next logically lowest priority stage (physically higher on the "thermometer") made up similarly of NOT gate 42, NOR gate 44, and NAND gate 46. NOR gate 44 supplies a signal to output terminal 16, and NAND gate 46 supplies its signal to the third lowest priority stage made up of NOT gate 52, NOR gate 54, and NAND gate 56. A similar fourth-lowest priority stage is shown which includes NOT gate 62, NOR gate 64, and NAND gate 66. Additional stages are indicated by the dashed result line provided on NAND gate 66.

In operation, matches are indicated on match lines 4, 6, 8, and 10 as logic 0, enable signal 12 having a logic high. Thus, in the first stage 30, if match line 4 is low, output 14 will be high, indicating a highest priority match on line 4. HPI 2 thus provides a single highest priority match.

In certain applications, it may be desirable to encode more than one highest priority input. For example, in CAMs, the comparand data bits are implemented such that a comparison can be made for a logic state of 1, a logic state of 0, or a "don't care" state wherein bits in the comparand register are masked as not to be involved in the matching search. A match is declared regardless of what state is in the respective "don't care" bits in the CAM words. These "don't care" bits are used typically in a search known in the art as a search for the longest match. As a result of a search for the longest match, multiple words in the CAM may match the un-masked data bits in the comparand register. In such a typical application, a special multi-match detection circuit indicates the presence of multiple matches. Using a typical prior art priority encoder, only one match, the one with the highest priority, is recorded. In order to determine the next highest priority match, the user must discard the highest priority match, and re-encode the CAM match results to obtain the next highest priority match. Such manual manipulation of the CAM results is time consuming and inefficient. It is desirable, instead, to find the identity of all the matching words.

A priority encoder is needed that can automatically successively encode by priority multiple matches in a CAM.

BRIEF SUMMARY OF THE INVENTION

This invention provides a priority encoder which automatically and successively encodes all the simultaneous matches in a CAM. The priority encoder includes a highest priority indicator configured to receive data on multiple CAM match lines. The priority encoder is successively cycled such that a highest priority active match line is successively flagged so long as a multiple match detector detects the presence of multiple simultaneously active match lines. Logic circuitry disables an active match line once it is flagged by the highest priority indicator so that on each subsequent cycle of the priority encoder, the next highest priority match of the multiple matches is detected and address encoded.

DETAILED DESCRIPTION OF THE INVENTION

Figure 2:
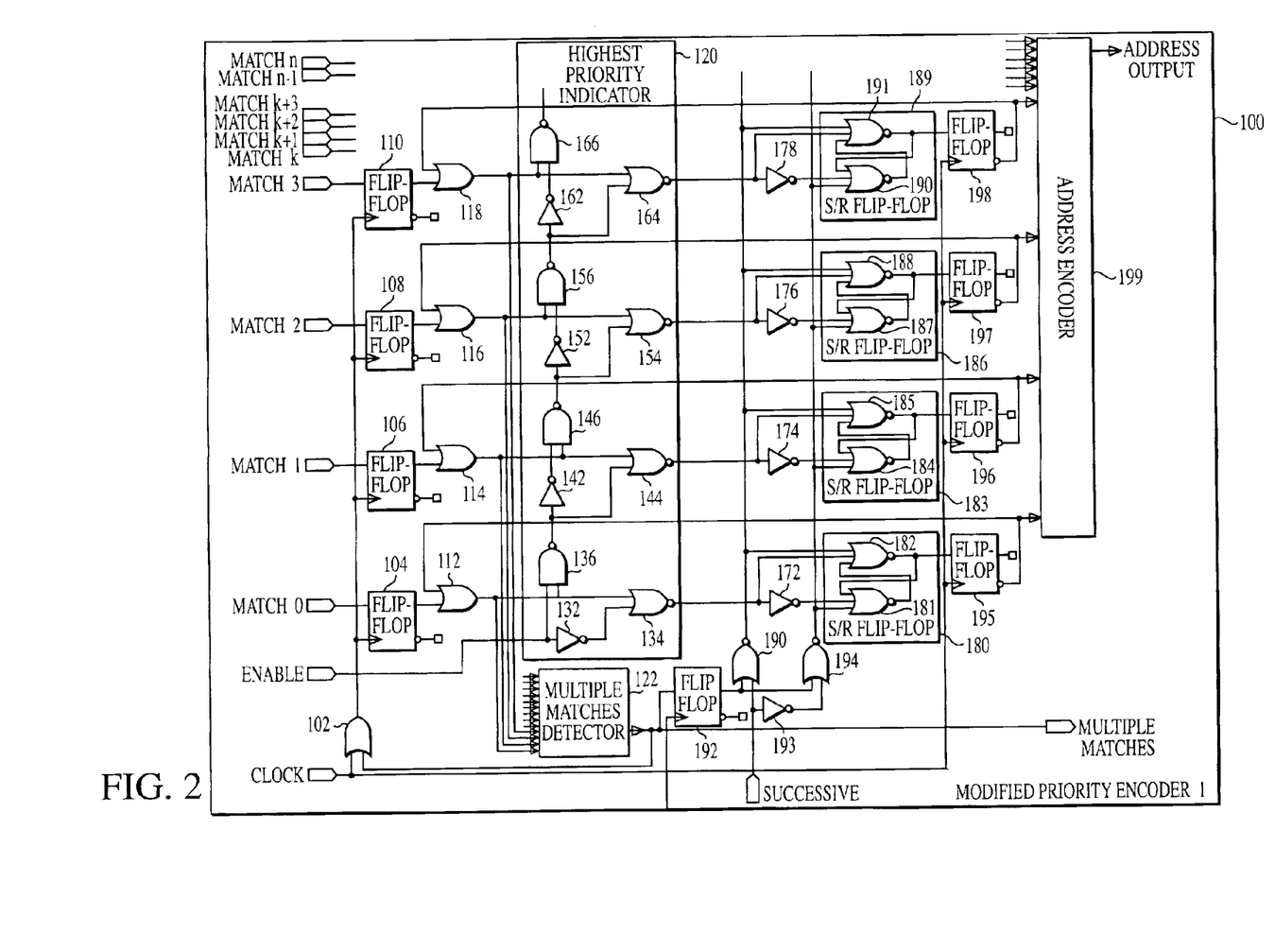
FIG. 2 illustrates a highest priority indicator according to an exemplary embodiment of the present invention.

Referring to FIG. 2, a four match line section 100 of a priority encoder according to an exemplary embodiment of the present invention is illustrated. Priority encoder section 100 includes four inputs MATCH 0–MATCH 3 for coupling to four match lines of a CAM. In the present embodiment, matches are driven to a logic low value when a match occurs between the CAM search word and its associated CAM data word, although the invention is easily adaptable for active high match lines.

A controlling clock signal line CLOCK is provided through OR gate 102 to flip-flops 104, 106, 108, and 110, which also receive respective inputs MATCH 0–MATCH 3. The outputs of flip-flops 104, 106, 108, and 110 form one input to respective OR gates 112, 114, 116, and 118. The other inputs to OR gates 112, 114, 116, and 118 are disabling signals described further below.

The outputs of OR gates 112, 114, 116, and 118 are provided to respective inputs of a highest priority indicator segment 120, described further below, and to a multiple match detector 122. Multiple match detector 122 determines whether simultaneous multiple matches are present on the match links (0 . . . 3). An exemplary embodiment of a multiple match detector according to the present invention is described in detail below in connection with FIG. 3.

The output of multiple match detector 122 is OR'd with the CLOCK signal in OR gate 102 so that, as long as multiple matches continue to be detected, operation of the priority encoder successively repeats until all simultaneous match lines are encoded.

During each cycle of the priority encoder, a highest priority match is indicated by highest priority indicator (HPI) 120, a portion of which is shown in FIG. 2. HPI 120 is identical in operation to HPI 2 described above in connection with FIG. 1, utilizing the same arrangement of logic gates to determine which of the inputs has the highest priority. Accordingly, each segment of HPI 120 includes a NOT (inverter) gate, a NAND gate, and a NOR gate. A highest priority stage of HPI 120 receives its input from OR gate 112 and includes NOT gate 132, which inverts an ENABLE input and supplies it to NOR gate 134. NOR gate 134 also receives a match signal from OR gate 112. The ENABLE signal is supplied to NAND gate 136, along with match line input from OR gate 112.

The four match line segment of priority encoder 100 includes three more stages in HPI 120. Thus, the result from NAND gate 136 is supplied to the next logically lowest priority stage (physically higher on the "thermometer") made up similarly of NOT gate 142, NOR gate 144, and NAND gate 146. NOR gate 144 supplies an output signal, and NAND gate 146 supplies its signal to the third lowest priority stage which includes NOT gate 152, NOR gate 154, and NAND gate 156. A similar fourth-lowest priority stage is shown which includes NOT gate 162, NOR gate 164, and NAND gate 166. Additional stages are indicated by the output line provided on NAND gate 166.

Signals from NOR gates 134, 144, 154, and 164, and inverted signals generated by NOT gates 172, 174, 176, and 178, are supplied to S/R flip-flops 180, 183, 186, and 189, respectively, represented as paired, three-input NOR gates 181 and 182, 184 and 185, 187 and 188, and 190 and 191 in FIG. 2. Each of the S/R flip-flops also receives control inputs from multiple matches detector 122, latched by flip-flop 192 with the CLOCK signal. Successive encoding takes place on all simultaneous multiple matches so long as multiple matches are detected. The last match is detected because S/R flip-flops 180, 183, 186, 189 operate when the output of NOR gates 190 and 194 both are logic LOW. When the multiple matches output goes HIGH, indicating multiple matches, that signal is clocked by the flip-flop 192 that feeds the gates 190 and 194. Since the output of flip-flop 192 lags one clock period behind the multiple match detector signal, the processing of the multi-match case is delayed by one clock period.

A SUCCESSIVE input further controls operation of the S/R flip-flops by providing a logic LOW when successive multi-match encoding is required. A logic HIGH resets the flip-flops and enables a new series of multiple match encoding.

The multiple match and CLOCK signals are provided by way of NOR gate 190 one side of the S/R flip-flops 180 . . . . 189. The multiple match signal, and an inverted SUCCESSIVE signal provided by NOT gate 193, are inputted by way of NOR gate 194 to another side of the S/R flip-flops.

The outputs of S/R flip-flops 180, 183, 186, and 189 are clocked with the CLOCK signal by way of master-slave flip-flops 195–198. The results are provided to address encoder 199, and also are fed back to OR gates 112, 114, 116, and 118.

The priority encoder 100 operates by way of the highest priority indicator 120, augmented with NOR gates 112, 114, 116, and 118 on each input. The NOR gates receive feed back information from S/R flip-flops 180, 183, 186, and 189, as applied to the master/slave flip-flops 195–198.

When multiple simultaneous matches are detected by multiple matches detector 122, the S/R flip-flops 180 . . . 189 are allowed to trip when an output of HPI 120 goes logic high. On the following clock transition, the output of the tripped SR flip-flop is clocked into the Master/Slave flip-flop 195 . . . 198 which follows it, causing its output to go to the logic high state as well. The high state also is fed back to the input of the OR gate on the input side of HPI 120, disabling the highest priority input, and allowing the next, lower priority input to be flagged by the HPI. Each time a highest priority match is detected, the output of flip-flops 195–198 also are received by address encoder 199 which generates the address of the corresponding data word of the then highest priority match.

This process repeats as long multiple matches are detected. Once there is only a single, unblocked match detected and encoded, the process stops automatically, and the SR flip-flops 180 . . . 189 are reset by a logic high on the SUCCESSIVE signal line, to prepare the circuit for further operations.

Figure 3:
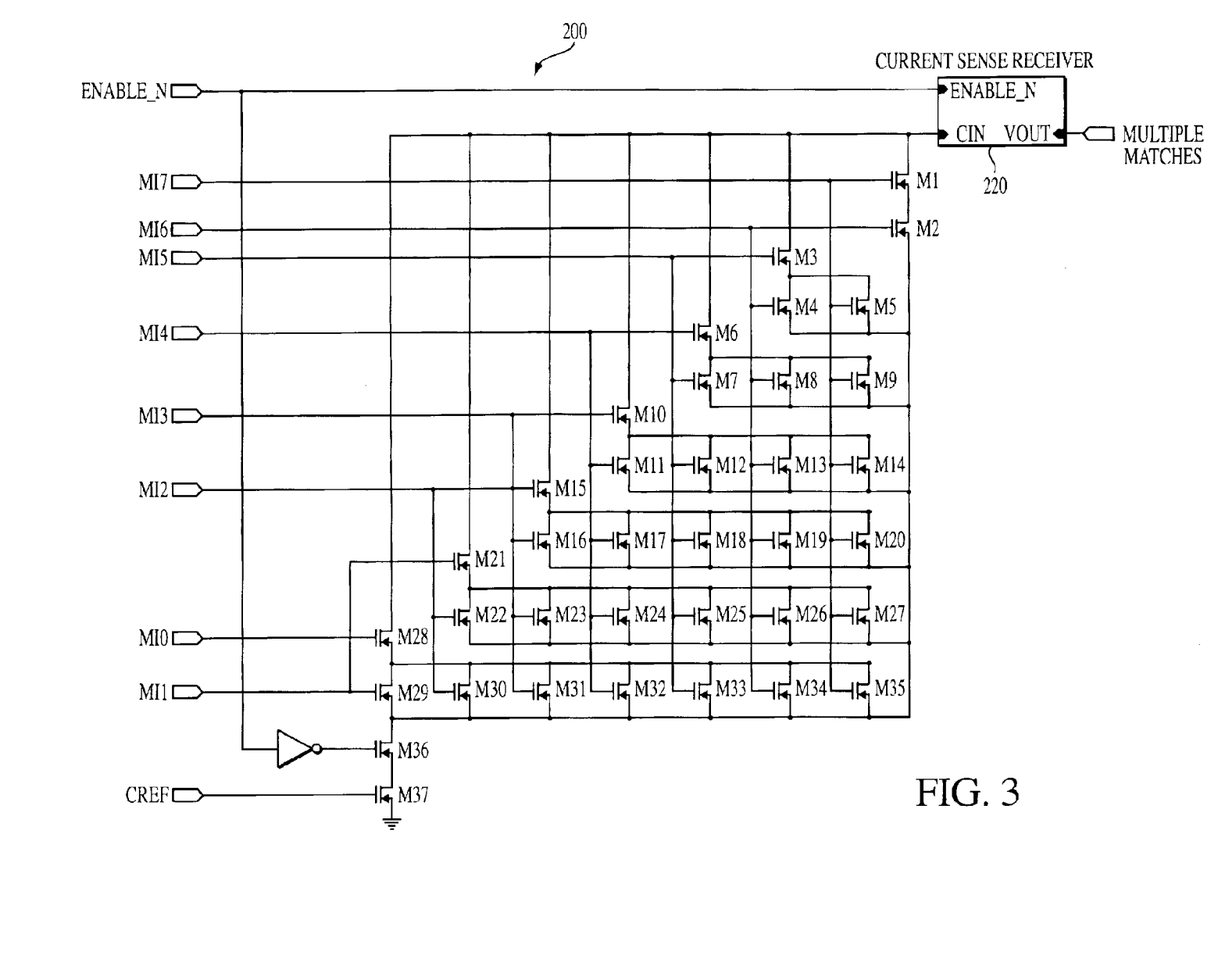
FIG. 3 illustrates a multiple match detector according to an exemplary embodiment of the present invention.

A transistor circuit 200 for use in multiple matches detector 122 is shown in detail in FIG. 3. Transistor circuit 200 receives multiple inputs on lines M11–M17 and an ENABLE signal. An array of transistor switches is provided such that if more than one of the inputs M11–M17 indicates an active match, the multiple match indicator will provide a logic high MULTIPLE MATCHES output signal indicating the presence of multiple, simultaneous matches.

The illustrated transistor circuit 200 functions as interconnected AND and OR current gates which provide a current drain at input CIN of current sensor 220 whenever multiple matches are present at the inputs MI1 . . . MI7 and an enable signal is present at ENABLE_N. A reference signal CREF also must be present for the circuit to operate. The MULTIPLE MATCHES output signal is present at the current sense receiver 220.

The transistor circuit 200 detects multiple matches in the CAM. The circuit finds all possible cases of any two simultaneous matches by performing an AND function between any two match-lines. In circuit 200, eight match-line inputs are provided, although the invention is not so limited. As can be seen, however, as the number of inputs grows, the number of AND gates required increases factorially.

Using current flow as the logic outcome, having two transistor switches in series equates to an AND gate, as both switches must be closed for current to flow. Likewise, a parallel connection of switches provides an OR function, as it is enough for one switch to be closed to allow current flow. In the circuit 200, current sensing receiver 220 detects any existing current flow, indicating at least two simultaneous matches. Receiver 220 is a synchronous device that operates only when enabled. Transistor M36 is provided to allow current flow in the circuit only when the receiver is enabled by signal ENABLE_N. Transistor M37 acts as a large controllable resistance which limits the magnitude of the current flowing through the receiver.

Figure 4:
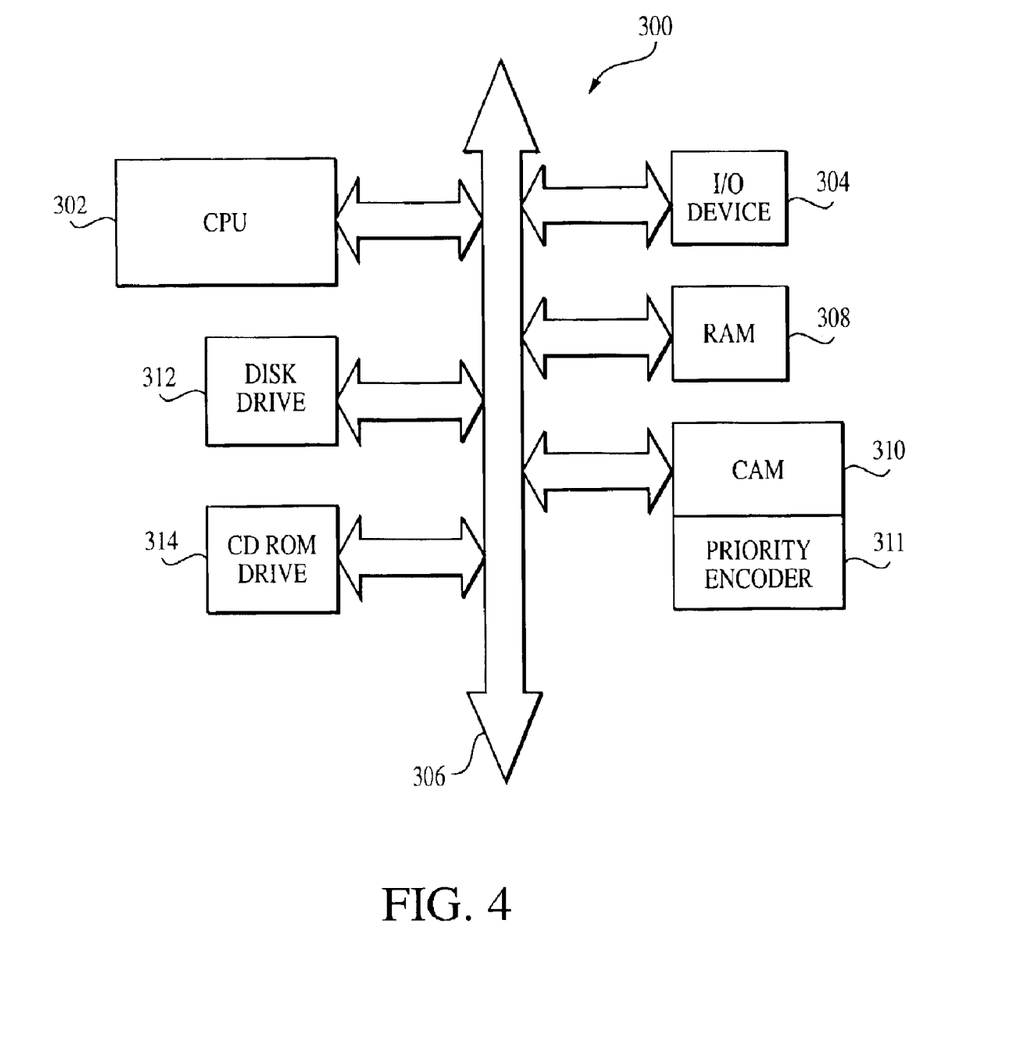
FIG. 4 illustrates a microprocessor based system which includes a CAM and a priority encoder according to an exemplary embodiment of the present invention.

Referring to FIG. 4, a processor system 300 is represented which uses a CAM 310 employing a multi-match priority encoder 311 according to the present invention. Processor system 300 generally comprises a central processing unit (CPU) 302, such as a microprocessor, that communicates with one or more input/output (I/O) devices 304 over a bus 306. The processor system 300 also includes random access memory (RAM) 308. One or more CAM devices 310 also communicate with CPU 302, CAM 310 utilizing a priority encoder 311 according to the present invention. The system may also include peripheral devices such as a floppy disk drive 312 and a compact disk (CD) ROM drive 314 which also communicate with CPU 302 over the bus 306.

Figure 5:
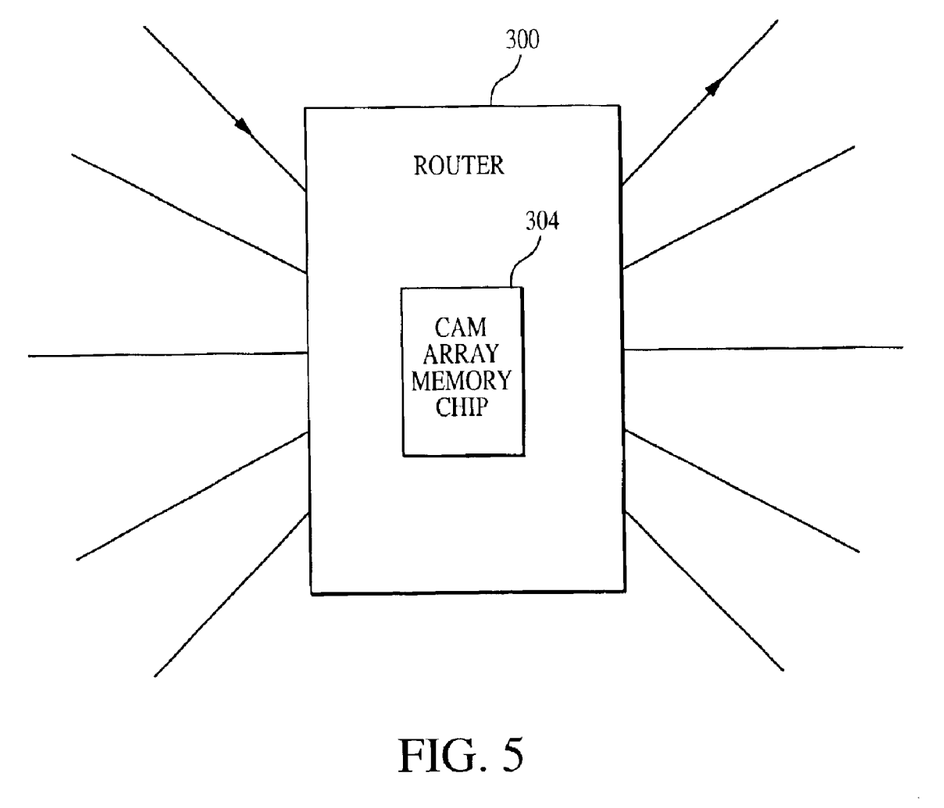
FIG. 5 illustrates a router which includes a CAM and a priority encoder according to an exemplary embodiment of the present invention.

FIG. 5 illustrates a router 300 including a CAM containing a multi-match priority encoder according to the present invention. Router 300 is connected to a CAM array memory chip 304 as may be used in a communications network, such as, e.g., part of the Internet backbone. Router 300 includes a plurality of input lines and a plurality of output lines. Data transmitted from one location to another is sent in packet form. Prior to the packet reaching its final destination, packet are received devices, such as router 300, for decoding data identifying the packet's ultimate destination, and deciding which output line and what forwarding instructions are required for the packet.

The present invention provides an apparatus and method for successively encoding multiple simultaneous matches in a CAM. While preferred embodiments of the invention have been described and illustrated above, it should be understood that these are exemplary of the invention and are not to be considered as limiting. Additions, deletions, substitutions, and other modifications can be made without departing from the spirit or scope of the present invention. Accordingly, the invention is not to be considered as limited by the foregoing description but is only limited by the scope of the appended claims.

What is claimed as new and desired to be protected by Letters Patent of the United States is:

1. A priority encoder comprising:
   a priority indicator configured to receive match data on multiple match lines and flag one of a highest and a lowest priority line;
   a multiple match detector configured to detect the presence of multiple simultaneously active match lines;
   logic circuitry for inactivating an active match line flagged by the priority indicator; and
   cycling circuitry for repeatedly cycling the priority indicator to flag each successive one of a highest and a lowest priority active match line and the logic circuitry to inactivate successive active match lines flagged by the priority indicator so long as the multiple match detector detects the presence of multiple simultaneously active match lines.

2. The priority encoder of claim 1, wherein the match data is received from a content addressable memory.

3. The priority encoder of claim 1, further comprising address encoding circuitry for outputting the address locations of each priority match line flagged by the priority indicator.

4. The priority encoder of claim 1, wherein the priority indicator includes a plurality of match indicator segments, each indicator segment being associated with a match line input.

5. The priority encoder of claim 4, wherein each indicator segment includes a NOR gate receiving an associated match line signal, a NOT gate passing an enable signal to the NOR gate, and a NAND gate linking the match line signal and the enable signal to a next priority segment.

6. The priority encoder of claim 4, wherein the logic circuitry includes a plurality of flip-flops respectively associated with each segment for inactivating active match lines.

7. The priority encoder of claim 1, wherein the priority indicator indicates a highest priority.

8. A content addressable memory comprising:
   a priority encoder having a priority indicator configured to receive match data on respective CAM word match lines and flag one of a highest and a lowest priority active match line;
   a multiple match detector configured to detect the presence of multiple simultaneously active match lines;
   logic circuitry for inactivating an active match line flagged by the priority indicator; and
   cycling circuitry for repeatedly cycling the priority indicator to flag each successive one of a respective highest or a lowest priority active match line if and the logic circuitry to inactivate successive active match lines flagged by the priority indicator so long as the multiple match detector detects the presence of multiple simultaneously active match lines.

9. The content addressable memory of claim 8, further comprising address encoding circuitry for outputting the address locations of each priority match line flagged by the priority indicator.

10. The content addressable memory of claim 8, wherein the priority indicator includes a plurality of indicator segments, each indicator segment being associated with a match line input.

11. The content addressable memory of claim 10, wherein each indicator segment includes a NOR gate receiving an associated match line signal, a NOT gate passing an enable signal to the NOR gate, and a NAND gate linking the match line signal and the enable signal to a next lower priority segment.

12. The content addressable memory of claim 11, wherein the logic circuitry includes a series of flip-flops associated with each segment for disabling active match lines.

13. A processor system comprising:
   a processor;
   a content addressable memory coupled to said processor said content addressable memory including:
   a priority encoder having a priority indicator configured to receive data on multiple match lines and flag one of a highest and a lowest priority active match line;
   a multiple match detector configured to detect the presence of multiple simultaneously active match lines;
   logic circuitry for disabling an active match line flagged by the priority indicator; and
   cycling circuitry for repeatedly cycling the priority indicator to flag each successive one of the respective highest or lowest priority active match line and inactivating successive active match lines flagged by the priority indicator so long as the multiple match detector detects the presence of multiple simultaneously active match lines.

14. The processor system of claim 13, further comprising address encoding circuitry for outputting the address locations of each priority match line flagged by the priority indicator.

15. The processor system of claim 13, wherein the priority indicator includes a plurality of match indicator segments, each indicator segment being associated with a match line input.

16. The processor system of claim 15, wherein each indicator segment includes a NOR gate receiving an associated match line signal, a NOT gate passing an enable signal to the NOR gate, and a NAND gate linking the match line signal and the enable signal to a next priority segment.

17. The processor system of claim 15, wherein the logic circuitry includes a plurality of flip-flops respectively associated with each segment.

18. The processor system of claim 13, wherein the priority indicator indicates a highest priority.

19. A router comprising:
   a plurality of message receiving inputs;
   a plurality of message transmitting outputs; and
   a content addressable memory (CAM) used to route messages on the inputs to the outputs, the CAM including:
   a priority encoder having a priority indicator configured to receive data on multiple match lines and flag one of a highest and a lowest priority active match line;
   a multiple match detector configured to detect the presence of multiple simultaneously active match lines;
   logic circuitry for inactivating an active match line flagged by the priority indicator; and
   cycling circuitry for repeatedly cycling the priority indicator to flag each successive one of a respective highest or lowest priority active match line and the logic circuitry to inactivate successive active match lines flagged by the priority indicator if the multiple match detector detects the presence of multiple simultaneously active match lines.

20. The router of claim 19, further comprising address encoding circuitry for outputting the address locations of each priority match line flagged by the priority indicator.

21. The router of claim 19, wherein the priority indicator includes a plurality of match indicator segments, each indicator segment being associated with a match line input.

22. The router of claim 21, wherein each indicator segment includes a NOR gate receiving an associated match line signal, a NOT gate passing an enable signal to the NOR gate, and a NAND gate linking the match line signal and the enable signal to a next priority segment.

23. The router of claim 21, wherein the logic circuitry includes a plurality of flip-flops respectively associated with each segment.

24. The router of claim 19, wherein the priority indicator indicates a highest priority.

25. A method of successively encoding multiple matches in a content addressable memory, the method comprising the steps of:
   inputting data on multiple match lines to a priority indicator for determining a priority of an active match;
   flagging a priority active match determined by the priority indicator;
   determining if multiple matches are present on the match lines;
   inactivating the flagged active match line;
   cycling the priority indicator to determine the next successive priority match; and
   successively repeating the flagging, determining and inactivating operations until no multiple matches are present.

26. The method of claim 25, wherein each priority match is a highest priority match.

27. The method of claim 25, further comprising encoding an address for each of the multiple matches.

28. A priority encoder comprising a hierarchical series of interconnected encoder stages, each stage including a match line input for receiving data from a memory location, an indicator segment that receives the data and generates a priority signal, and a lockout gate for removing a highest priority signal from being received by the indicator segment.

29. The priority encoder of claim 28, further comprising a multiple simultaneous match indicator circuit for indicating multiple simultaneous matches on the match line inputs.

30. The priority encoder of claim 29, further comprising cycling circuitry for successively cycling the priority encoder if multiple simultaneous matches are indicated.

31. The priority encoder of claim 30, further comprising address encoding circuitry for encoding addresses of successive matches indicated by the priority encoder.

32. A method of operating a priority encoder comprising:
   providing outputs developed respectively from match line signals associated with respective memory locations, each signal indicating a match with a respective word stored in a memory location, to a priority indicator and to a multiple match detector of the priority encoder;
   determining whether multiple matches are present on the match line signals using the multiple match detector; and processing the multiple matches indicated by the match line signals such that addresses of the respective memory locations are provided successively in a hierarchical priority match order.

33. The method of claim 32, comprising successively cycling through the match line signals to obtain the addresses of the respective memory locations for successive priority matches so long as multiple simultaneous matches are indicated.

34. The method of claim 32, further comprising encoding addresses of matches indicated.

35. A method of successively encoding multiple matches in a content addressable memory, the method comprising the steps of:
  (a) detecting multiple simultaneous matches in the content addressable memory;
  (b) determining a highest priority match;
  (c) removing the highest priority match determined in step (b) as one of the multiple simultaneous matches; and
  (d) repeating steps (a) through (c) until multiple simultaneous matches are no longer detected.

36. A method of operating a router, the method comprising steps of:
  receiving a plurality of message inputs;
  transmitting a plurality of message outputs; and
  routing messages on the inputs to the outputs using a content addressable memory (CAM), the CAM performing the method of:
    receiving data on multiple match lines with a priority encoder having a highest priority indicator, and flagging a highest priority active match line;
    detecting the presence of multiple matches using a multiple match detector;
    disabling an active match line flagged by the highest priority indicator; and
    operating the highest priority indicator again to flag a highest priority match line if the multiple match detector detects the presence of multiple active match lines.

37. A method of successively encoding multiple matches in a content addressable memory, the method comprising:
  receiving signals associated with respective memory locations, each signal indicating a match of a search word with a respective word stored in a memory location;
  providing the signals to a priority indicator and to a multiple match detector; and
  processing the signals such that addresses of the respective memory locations matching the search word are provided successively in a priority order.

38. The method of claim 37, wherein the step of processing the signals includes the steps of determining a highest priority match from among the signals, and removing the highest priority match as one of the signals in a next following highest priority match determination.

39. A content addressable memory comprising:
  multiple match lines carrying signals associated with respective memory locations, each signal indicating a match of a search word with a respective word stored in a memory location; and
  a priority encoder arranged and configured to repeatedly process the match signals such that addresses of matching memory locations are provided successively in a priority order.

40. The content addressable memory of claim 39, wherein the priority encoder includes a series of indicator stages, each stage receiving an input on one of the multiple match lines.

41. The content addressable memory of claim 40, wherein each indicator stage includes a priority logic circuit for receiving the match line input and generating a signal indicating a priority match.

42. The content addressable memory of claim 41, wherein each indicator stage includes a lock-out circuit for successively blocking highest priority matches from being received as match line input to the indicator stage.

43. The content addressable memory of claim 8, wherein the priority indicator flags a highest priority active match line.

* * * * *

UNITED STATES PATENT AND TRADEMARK OFFICE
CERTIFICATE OF CORRECTION

PATENT NO. : 6,934,172 B2
DATED : August 23, 2005
INVENTOR(S) : Alon Regev et al.

It is certified that error appears in the above-identified patent and that said Letters Patent is hereby corrected as shown below:

Column 5,
Line 66, "packet are received devices" should read -- packets are received by devices --.

Column 6,
Line 63, "line if and" should read -- line and --.

Signed and Sealed this

Twenty-ninth Day of November, 2005

JON W. DUDAS
*Director of the United States Patent and Trademark Office*